(12) United States Patent
Bruce et al.

(10) Patent No.: US 6,281,028 B1
(45) Date of Patent: Aug. 28, 2001

(54) LED ALIGNMENT POINTS FOR SEMICONDUCTOR DIE

(75) Inventors: Michael R. Bruce; Jeffrey D. Birdsley; Rosalinda M. Ring; Rama R. Goruganthu; Brennan V. Davis, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,087

(22) Filed: Sep. 30, 1999

(51) Int. Cl.[7] .................................................. H01L 21/66
(52) U.S. Cl. ........................................................... 438/16
(58) Field of Search ................................ 438/4, 5, 7, 14, 438/16, 108; 257/48, 778; 250/252.1, 330

(56) References Cited

U.S. PATENT DOCUMENTS 5,834,323 * 11/1998 Ghafghaichi et al. ................. 438/17
5,998,232 * 12/1999 Maruska ................................ 438/46

* cited by examiner

Primary Examiner—Keith Christianson

(57) ABSTRACT

Post-manufacturing analysis of a semiconductor device is enhanced via a method and system that use a light emitting diode (LED) formed in a semiconductor die during its manufacture. According to an example embodiment of the present invention, a LED is formed within a semiconductor die having a circuit side opposite a back side. A conductor is formed that extends from the LED to the back side of the die, and is coupled to a terminal formed on the back side. The LED is activated via the terminal and used to align the die for analysis. By forming a LED within the semiconductor die during its manufacture, post manufacturing analysis is enhanced by the alignment capabilities provided by the readily activated LED.

21 Claims, 4 Drawing Sheets

LED ALIGNMENT POINTS FOR SEMICONDUCTOR DIE

FIELD OF THE INVENTION

The present invention relates generally to semiconductor devices and their fabrication and, more particularly, to semiconductor devices and their manufacture involving techniques for aligning an integrated circuit for analysis.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Traditionally, integrated circuit dies have been tested using methods including accessing circuitry or devices within the die. In order to access portions of circuitry in the integrated circuit die it is sometimes necessary to align the die with equipment such as a milling device, a test fixture, or other test equipment. For example, in flip-chip type dies, transistors and other circuitry are located in a very thin epitaxially-grown silicon layer in a circuit side of the die. The circuit side of the die is arranged facedown on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the chip. Such back side access often requires milling through the back side and probing certain circuit elements. The milling and probing processes may potentially damage elements in the integrated circuit if not properly aligned. The difficulty, cost, and destructive aspects of existing methods for testing integrated circuits are impediments to the growth and improvement of semiconductor technologies. To access the backside circuitry, it is necessary to align the circuit with a CAD layout. This is done with alignment markers; however, alignment markers are not visible through silicon from the backside with most tools without substantial thinning.

SUMMARY OF THE INVENTION

The present invention is directed to a method for manufacturing and analyzing a semiconductor die that improves the ability to align the die for post-manufacturing testing. The present invention is exemplified in a number of implementations and applications, some of which are summarized below.

According to an example embodiment of the present invention, a semiconductor die having a light-emitting diode (LED) is formed. The semiconductor die has a circuit side opposite a back side. A terminal is formed in the back side, and a conductor is formed extending from the terminal and toward the circuit side. A LED is formed within the semiconductor die and coupled to the conductor. The LED is activated via the terminal and used for aligning the die for analysis. The activated LED provides a detectable reference point from which to align the die for analysis, such as for milling or testing defective dies.

According to another example embodiment of the present invention, a system is arranged to analyze a semiconductor die having a LED formed within the die and a conductor coupled to the LED and extending to a terminal on the surface of the die. A power source is coupled to the terminal to activate the LED via the conductor. A radiation detection device is arranged to detect radiation emitted from the activated LED. Using the detected radiation, the die is aligned in a test fixture. The system further includes test equipment arranged to analyze the die once it has been aligned.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
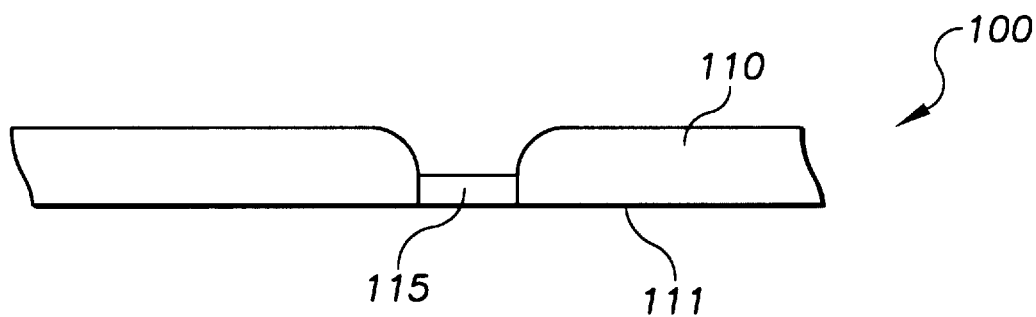
FIGS. 1–4 show a portion of a semiconductor die being fabricated, according to an example embodiment of the present invention.
Figure 2:
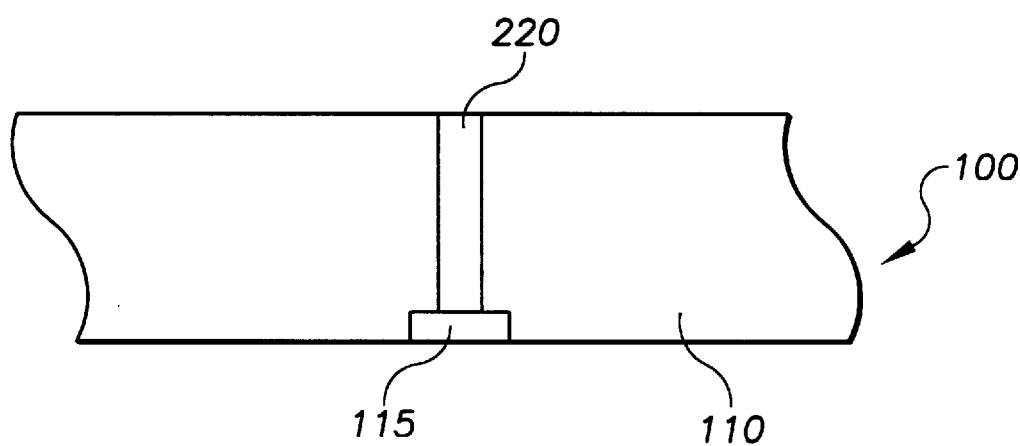
Figure 3:
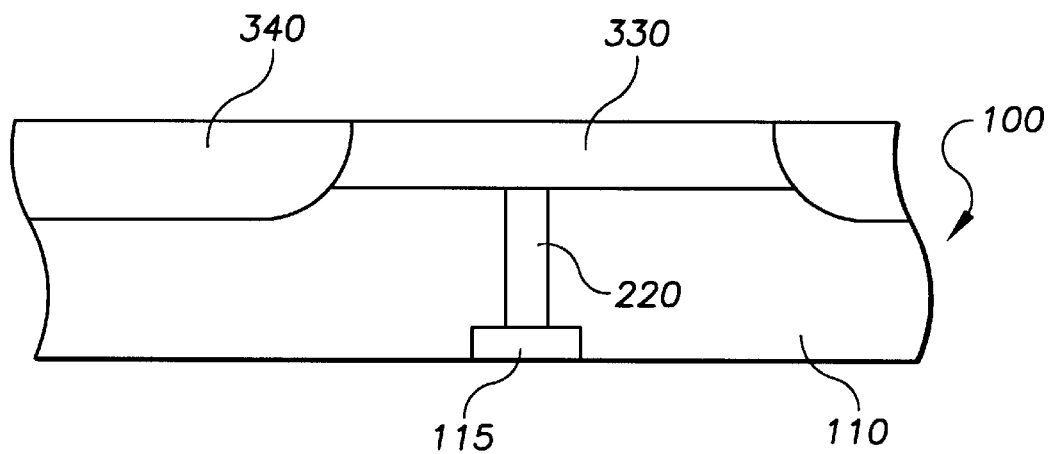

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for flip-chips and other types of integrated circuit dies requiring or benefiting from alignment for post-manufacturing analysis. While the present invention is not necessarily limited to such devices, various aspects of the invention may be appreciated through a discussion of various examples using this context.

According to an example embodiment of the present invention, a semiconductor die is manufactured with a LED formed within the die. The LED is connected to a terminal via a conductor. When a power supply is connected to the terminal, the LED is powered and emits radiation. The radiation can be detected and used to align the die. For example, the position of the LED can be pre-determined on a circuit layout. By detecting the radiation, the location of the LED is found. Using the location of the LED as a reference point, the die can be aligned with a circuit layout and other circuitry or devices within the die can be determined. Identifying the location of circuitry or devices within the die is useful for post-manufacturing analysis, such as aligning for milling the device, forming probes and making contact to a portion of circuitry within the device, or aligning for exciting portions of the device for analysis.

One example manner in which to create the LED is by forming a p-n junction using a III-V compound such as Gallium-arsenide. In an essential reversion of the creation of electron-hole pairs, energy is released when an electron recombines with a hole. More specifically, when an electron drops into a hole in the p-n junction, a photon of energy is generated. Using the Gallium-arsenide diode, the photon radiation generated during recombination is detectable for alignment. Another way is to forward bias a Si p-n junction.

Figure 4:
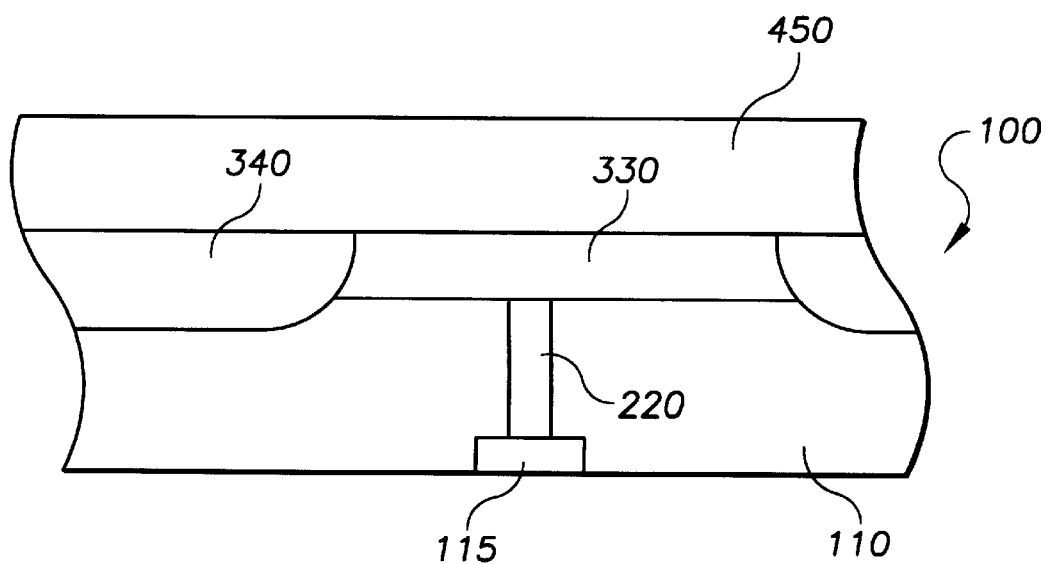

According to a more particular example embodiment of the present invention, FIGS. 1–4 show a portion 100 of a semiconductor die being fabricated. In FIG. 1, back side substrate 110 has been formed and a terminal 115 is formed in the substrate 110 at the surface 111. Once the terminal 115 is formed, additional substrate is formed to complete the back side and a conductor 220 is formed in the back side, coupled to the terminal 115, and extending away from the back side surface 111 of the die. Trench isolation 340 and LED 330 are formed, and the conductor 220 is coupled to the LED 330. In FIG. 4, the circuit side 450 is formed to complete the fabrication of the portion of die.

Figure 5:
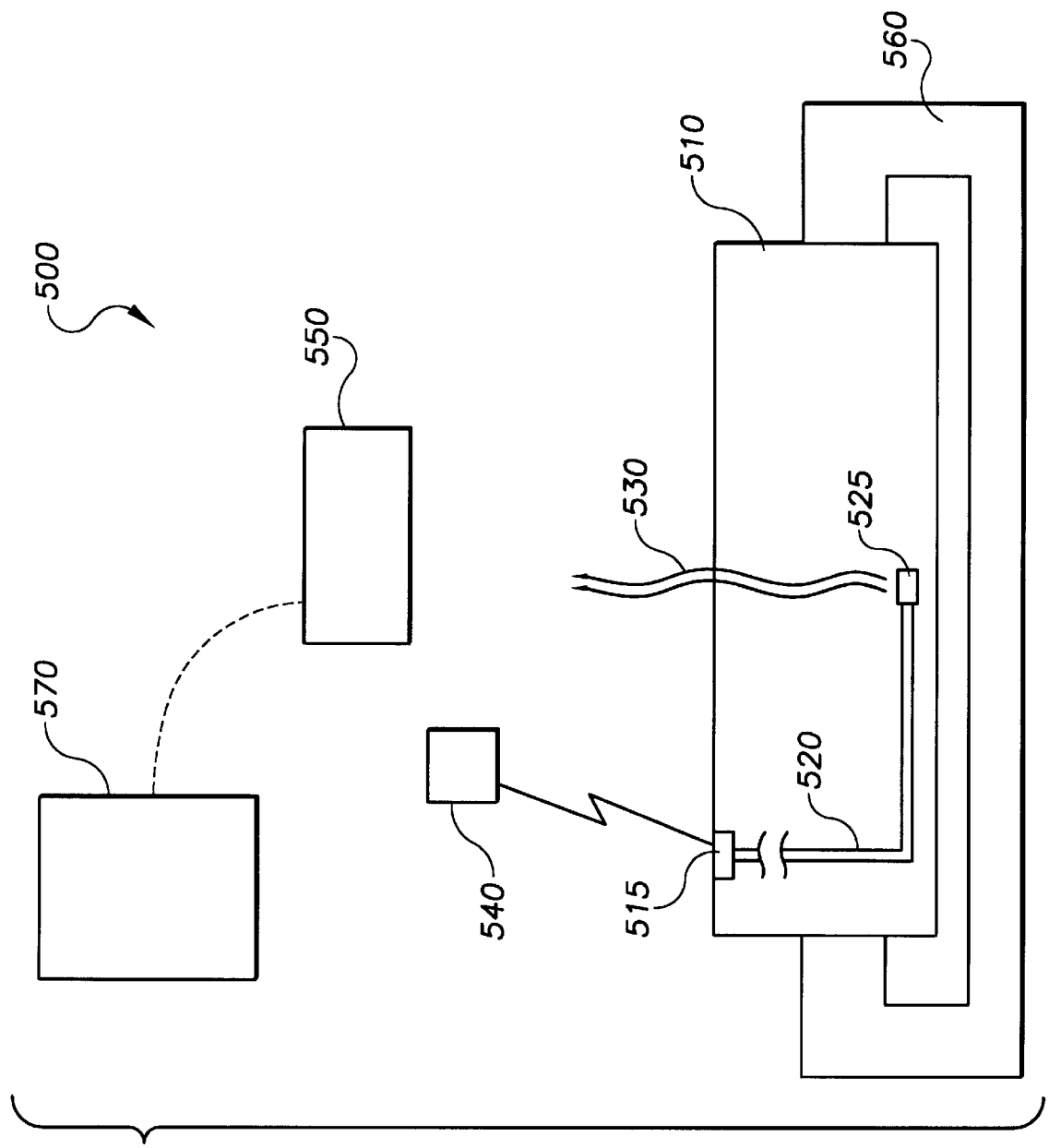
FIG. 5 shows a semiconductor die undergoing analysis, according to another example embodiment of the present invention.

The LED in the die of FIGS. 1–4 can be activated via a power source coupled to the terminal. FIG. 5 shows a system 500 for powering an LED formed in a semiconductor die, such as in FIGS. 1–4, and using the LED for alignment purposes, according to another example embodiment of the present invention. The die 510 is arranged in a test fixture 560. A power source 540 is coupled to LED 525 within the die via a terminal 515 on the back side of the die and a conductor 520. Radiation 530 is emitted from the LED in response to the power source 540 and is detected at radiation detection device 550. A camera or a microscope capable of detecting IR or visible light can be used to detect the radiation 530. Using the detected radiation, the position of the LED is determined and the die is aligned for analysis. In another implementation, a computer arrangement 570 is coupled to the detection device 550 and arranged to use the detected radiation to align the die.

Figure 6:
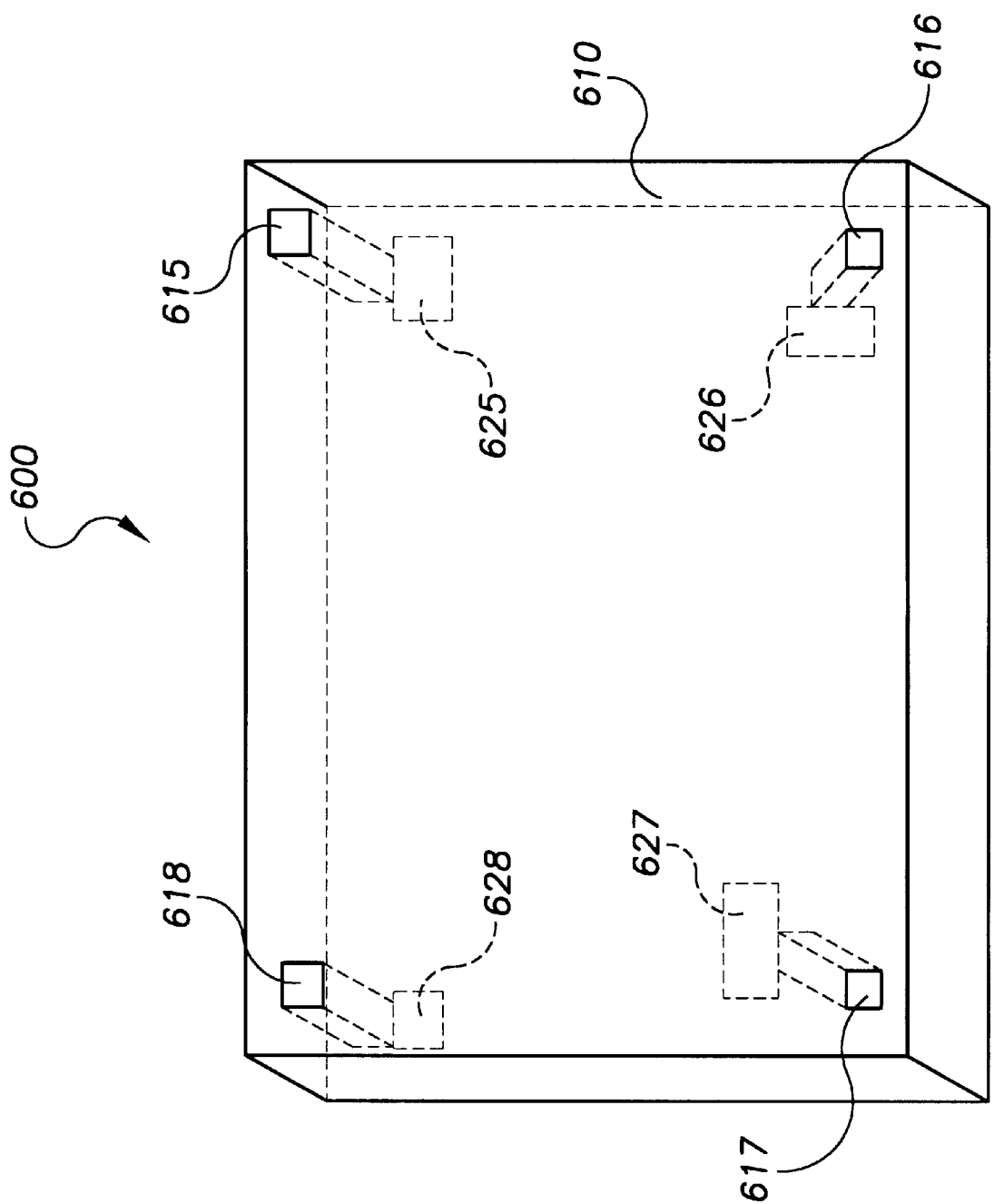
FIG. 6 is an overview of a semiconductor die, according to another example embodiment of the present invention.

According to another example embodiment of the present invention, LEDs are formed in more than one location in a semiconductor die. The LEDs are powered and used for alignment. By using more than one LED, alignment of the die can be achieved in a more accurate manner than with a single LED. For example, FIG. 6 shows an overview 600 of a semiconductor die 610. Four terminals 615, 616, 617, and 618 are located in the corner regions of the die 610. Each terminal is connected via a conductor to LEDs 625, 626, 627, and 628, respectively. When the terminals are coupled to a power source and the LEDs are activated, the radiation from the LEDs can be detected and used to align the die 610.

While the present invention has been described with reference to several particular example embodiments, those skilled in the art will recognize that many changes may be made thereto without departing from the spirit and scope of the present invention, which is set forth in the following claims.

What is claimed is:

1. A method for manufacturing and analyzing a semiconductor die having circuitry in a circuit side opposite a back side, the method comprising:

forming a terminal in the back side;

forming a conductor extending from the terminal and toward the circuit side;

forming a light emitting diode (LED) within the semiconductor die and coupled to the conductor;

activating the LED via the terminal; and using the activated LED and aligning the die for analysis.

2. The method of claim 1, wherein the terminal is formed on the back side surface of the die.

3. The method of claim 1, wherein the terminal is buried in a portion of the back side, further comprising removing a portion of the back side and exposing the terminal prior to activating the LED via the terminal.

4. The method of claim 1, further comprising:

forming an additional LED coupled to a terminal via a conductor;

activating the additional LED via the terminal; and using the additional LED for aligning the die.

5. The method of claim 4, wherein each LED is coupled to a separate terminal.

6. The method of claim 4, wherein each LED is coupled to the same terminal.

7. The method of claim 1, wherein aligning the die includes aligning the die with a substrate removal device, and wherein analyzing the semiconductor die includes removing a portion of the back side.

8. The method of claim 1, wherein aligning the die includes aligning the die in a test fixture.

9. The method of claim 1, wherein aligning the die includes aligning the die with a microscope, and wherein analyzing the semiconductor die includes using the microscope.

10. The method of claim 1, wherein using the activated LED and aligning the die includes using infrared (IR) imaging to locate the LED and aligning the die to the located LED.

11. The method of claim 1 wherein aligning the die comprises aligning the die with a circuit layout for the die and using the circuit layout to locate target circuitry.

12. The method of claim 11, wherein the target circuitry includes circuitry suspected of being defective.

13. The method of claim 1, wherein the LED is forward-biased.

14. A system for analyzing a semiconductor die having circuitry in a circuit side opposite a back side, and having at least one LED formed within the die and coupled to a terminal via a conductor, the system comprising:

a power source coupled to the terminal to activate the LED;

a radiation detection device arranged to detect radiation emitted from the activated LED;

a test fixture adapted to use the detected radiation and align the die; and test equipment configured and arranged to analyze the die.

15. A system, according to claim 14, wherein the radiation detection device includes an IR camera.

16. A system, according to claim 14, wherein the radiation detection device includes a laser scanning microscope.

17. A system, according to claim 14, wherein the test fixture includes a computer arranged to compare the alignment with a circuit layout of the die and align the die with the circuit layout.

18. A system, according to claim 17, wherein the test fixture includes the power source.

19. A system, according to claim 14, wherein the test equipment includes at least one of: a FIB milling device, a laser, a microscope, a power supply, a signal generator, and a radiation detection device.

20. A system for analyzing a semiconductor die having circuitry in a circuit side opposite a back side, and having at least one LED formed within the die and coupled to a terminal via a conductor, the system comprising:

means for activating the LED via the terminal;

means for detecting the activated LED;

means for using the detected LED and aligning the die; and means for analyzing the die.

21. A method for analyzing a semiconductor die having circuitry in a circuit side opposite a back side, and having at least one LED formed within the die and coupled to a terminal via a conductor, the method comprising:

activating the LED via the terminal;

detecting the activated LED;

using the detected LED and aligning the die; and analyzing the die.

* * * * *